United States Patent
Ko et al.

(10) Patent No.: US 8,901,498 B2
(45) Date of Patent: Dec. 2, 2014

(54) UNIT PIXELS, DEPTH SENSORS AND THREE-DIMENSIONAL IMAGE SENSORS INCLUDING THE SAME

(75) Inventors: Hyoung-Soo Ko, Gyeonggi-do (KR);
Shin-Wook Yi, Gyeonggi-do (KR);
Won-Joo Kim, Gyeonggi-do (KR);
Ju-Hwan Jung, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 322 days.

(21) Appl. No.: 13/464,324

(22) Filed: May 4, 2012

(65) Prior Publication Data
US 2012/0281206 A1   Nov. 8, 2012

(30) Foreign Application Priority Data

May 6, 2011   (KR) .................. 10-2011-0043178

(51) Int. Cl.
| | |
|---|---|
| *G01T 1/24* | (2006.01) |
| *G01J 1/42* | (2006.01) |
| *G01S 7/481* | (2006.01) |
| *G01S 7/486* | (2006.01) |
| *H01L 27/146* | (2006.01) |
| *H04N 5/369* | (2011.01) |
| *G01S 17/89* | (2006.01) |
| *H04N 5/3745* | (2011.01) |

(52) U.S. Cl.
CPC ......... *H01L 27/14603* (2013.01); *G01J 1/4228* (2013.01); *G01S 7/4816* (2013.01); *G01S 7/4861* (2013.01); *H04N 5/3696* (2013.01); *G01S 17/89* (2013.01); *H04N 5/3745* (2013.01)
USPC ...................................... 250/338.4

(58) Field of Classification Search
USPC ............. 250/338.1, 338.4, 362, 363.03; 356/4.01, 4.07
See application file for complete search history.

(56) References Cited

U.S. PATENT DOCUMENTS

| | | |
|---|---|---|
| 2006/0192938 A1 | 8/2006 | Kawahito |
| 2007/0158770 A1 | 7/2007 | Kawahito |
| 2009/0284731 A1 | 11/2009 | Jin et al. |

FOREIGN PATENT DOCUMENTS

| | | |
|---|---|---|
| JP | 2004294420 A | 10/2004 |
| KR | 20060077076 A | 7/2006 |
| KR | 20070009591 A | 1/2007 |
| KR | 20090118795 A | 11/2009 |

*Primary Examiner* — Mark R Gaworecki
(74) *Attorney, Agent, or Firm* — Harness, Dickey & Pierce, P.L.C.

(57) ABSTRACT

A unit pixel of a depth sensor includes a light-receiver configured to perform photoelectric conversion of an incident light to output an electrical signal and at least two sensors adjacent to the light-receiver to receive the electrical signal from the light-receiver such that a line connecting the sensors forms an angle greater than zero degrees with respect to a first line, the first line passing through a center of the light-receiver in a horizontal direction.

20 Claims, 21 Drawing Sheets

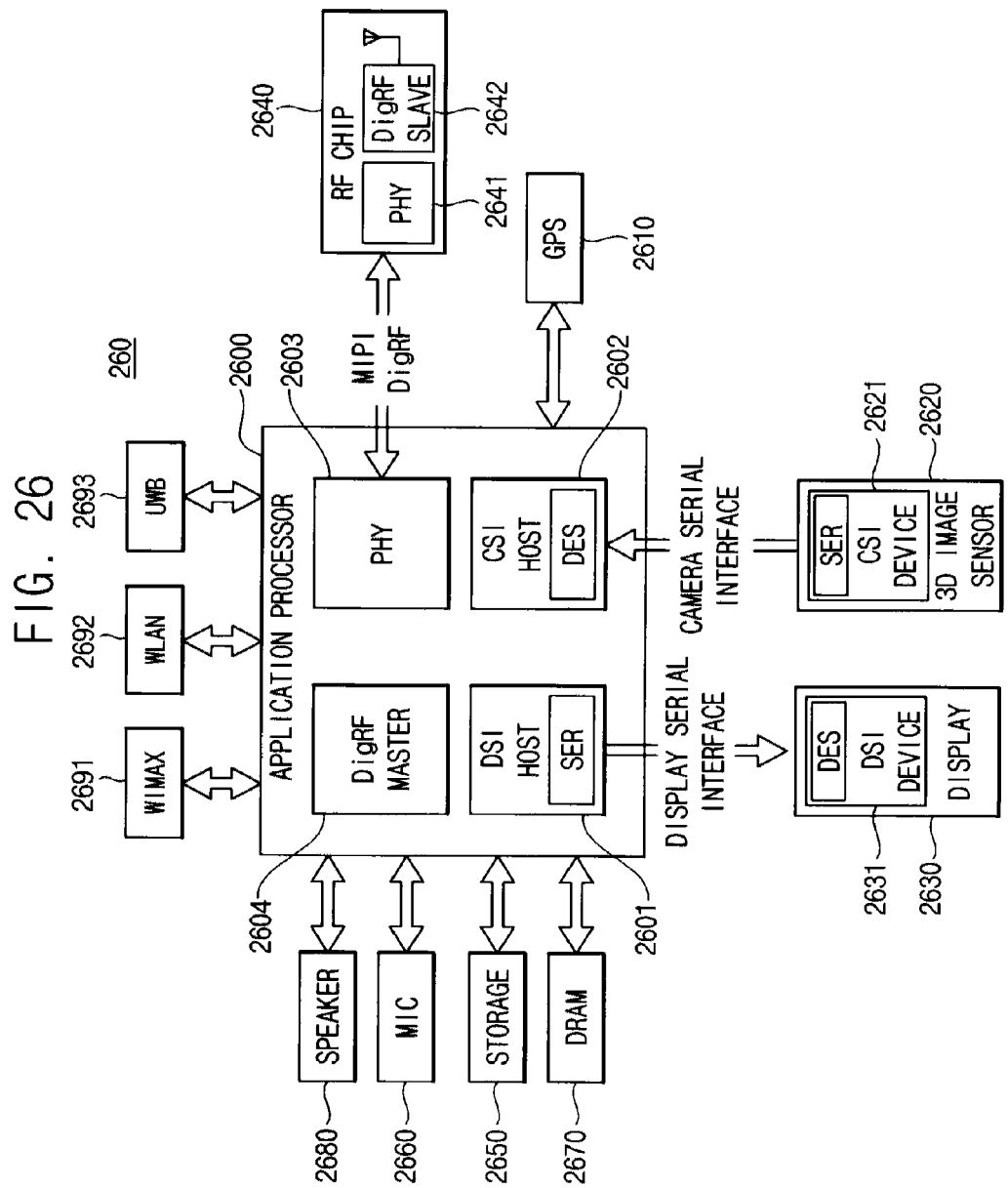

US 8,901,498 B2

UNIT PIXELS, DEPTH SENSORS AND THREE-DIMENSIONAL IMAGE SENSORS INCLUDING THE SAME

CROSS-REFERENCE TO RELATED APPLICATION

This application claims priority under 35 U.S.C. §119 to Korean Patent Application No. 10-2011-0043178, filed on May 6, 2011 in the Korean Intellectual Property Office (KIPO), the entire contents of which are incorporated herein by reference.

BACKGROUND

1. Technical Field

Example embodiments relate generally to semiconductor devices, and more particularly to a unit pixel, a depth sensor and a three-dimensional image sensor including the unit pixel.

2. Description of the Related Art

Various sensors are widely used for sensing physical quantities such as light intensity, temperature, mass, time, etc. The sensors may include a pixel or a pixel array configured to output electrical signals corresponding to the physical quantity. Recently, sensors and associated methods are developed to measure a distance to an object in addition to a color image of the object.

SUMMARY

Some example embodiments provide a unit pixel and a depth sensor of a time-of-flight (TOF) type including the unit pixel, which may reduce a sensing error in measuring a distance to an object.

Some example embodiments provide a depth sensor and a device of measuring a distance and an image such as a three-dimensional image sensor device, which may enhance a demodulation contrast (DC).

According to example embodiments, a unit pixel of a depth sensor includes a light-receiver and at least two sensors. The light-receiver performs photoelectric conversion of an incident light to output an electrical signal. The sensors are adjacent to the light-receiver to receive the electrical signal from the light-receiver such that a first imaginary line connecting the sensors forms an angle greater than zero degrees with respect to a second imaginary line, where the second imaginary line passes through a center of the light-receiver in a horizontal direction.

The light-receiver may be between the sensors and the sensors may be asymmetrical with respect to the second imaginary line and a third imaginary line, where the third imaginary line passes through the center of the light-receiver in a vertical direction perpendicular to the horizontal direction.

The first imaginary line connecting the sensors may form an angle between zero degrees and forty-five degrees with respect to the second imaginary line.

In some example embodiments, the unit pixel may further include one or more photo gates on the light-receiver, the photo gates configured to control a transfer of the electrical signal to the sensors depending on voltages received by the photo gates.

The sensors may correspond one-to-one with the photo gates. At least one of the sensors may be configured to drain the electrical signal.

In some example embodiments, the unit pixel may further include one or more transfer gates configured to control a transfer of the electrical signal to the sensors depending on voltages received by the transfer gates, each transfer gate on a region between each sensor and the light-receiver.

The incident light may include an infrared light.

According to example embodiments, a depth sensor includes a pixel array including a plurality of unit pixels, and a circuit configured to calculate distance information based on signals from the pixel array. Each unit pixel includes a light-receiver configured to perform photoelectric conversion of an incident light to output an electrical signal, and at least two sensors adjacent to the light-receiver to receive the electrical signal from the light-receiver such that a first imaginary line connecting the sensors forms an angle greater than zero degrees with respect to a second imaginary line, the second imaginary line passing through a center of the light-receiver in a horizontal direction.

The light-receiver may be between the sensors and the sensors may be asymmetrical with respect to the second imaginary line and a third imaginary line, the third imaginary line passing through the center of the light-receiver in a vertical direction perpendicular to the horizontal direction.

The first imaginary line connecting the sensors may form an angle between zero degrees and forty-five degrees with respect to the second imaginary line.

Each unit pixel may further include one or more photo gates on the light-receiver, the photo gates configured to control a transfer of the electrical signal to the sensors depending on voltages received by the photo gates.

In some example embodiments, the depth sensor may further include a timing controller configured to control a timing of applying the voltages to the photo gates, and a light source configured to output a light signal, the timing controller configured to control the light source.

The light signal may include an infrared light and the light source may include a laser diode.

The sensors may correspond one-to-one with the photo gates. At least one of the sensors may be configured to drain the electrical signal.

Each unit pixel may further include one or more transfer gates configured to control a transfer of the electrical signal to the sensors depending on voltages received by the transfer gates, each transfer gate on a region between each sensor and the light-receiver.

According to some example embodiments, a three-dimensional image sensor device includes a pixel array including a plurality of unit pixels, and a circuit configured to calculate distance information and image information based on signals from the pixel array. Each unit pixel includes a light-receiver configured to perform photoelectric conversion of an incident light to output an electrical signal, and at least two sensors adjacent to the light-receiver to receive the electrical signal from the light-receiver such that a first imaginary line connecting the sensors are asymmetrical with respect to a second imaginary line and a third imaginary line and the first imaginary line connecting the sensors forms an angle between zero degrees and forty-five degrees with respect to the second imaginary line, the second imaginary line passing through a center of the light-receiver in a horizontal direction, the third imaginary line passing through the center of the light-receiver in a vertical direction perpendicular to the horizontal direction .

Each unit pixel may further include one or more photo gates on the light-receiver, and the photo gates may be configured to control a transfer of the electrical signal to the sensors depending on voltages received by the photo gates.

The three-dimensional image sensor may further include a timing controller configured to control a light source and a timing of applying the voltages to the photo gates, that light source configured to output a light signal under a control of the timing controller.

The unit pixels may include first pixels configured to sense a distance to an object and second pixels configured to sense an image of the object, and the first pixels and the second pixels may be disposed repeatedly.

At least another example embodiment discloses an image sensor including at least one pixel including a receiver configured to receive light and convert the light into an electrical signal, the receiver having vertical and horizontal axes and at least first and second sensors adjacent to the receiver, the first and second sensors being asymmetrical with respect to the vertical and horizontal axes.

BRIEF DESCRIPTION OF THE DRAWINGS

Illustrative, non-limiting example embodiments will be more clearly understood from the following detailed description taken in conjunction with the accompanying drawings.

FIG. 26 is a block diagram illustrating an example of an interface used in a computing system of FIG. 25.

DETAILED DESCRIPTION OF EXAMPLE EMBODIMENTS

Figure 1:
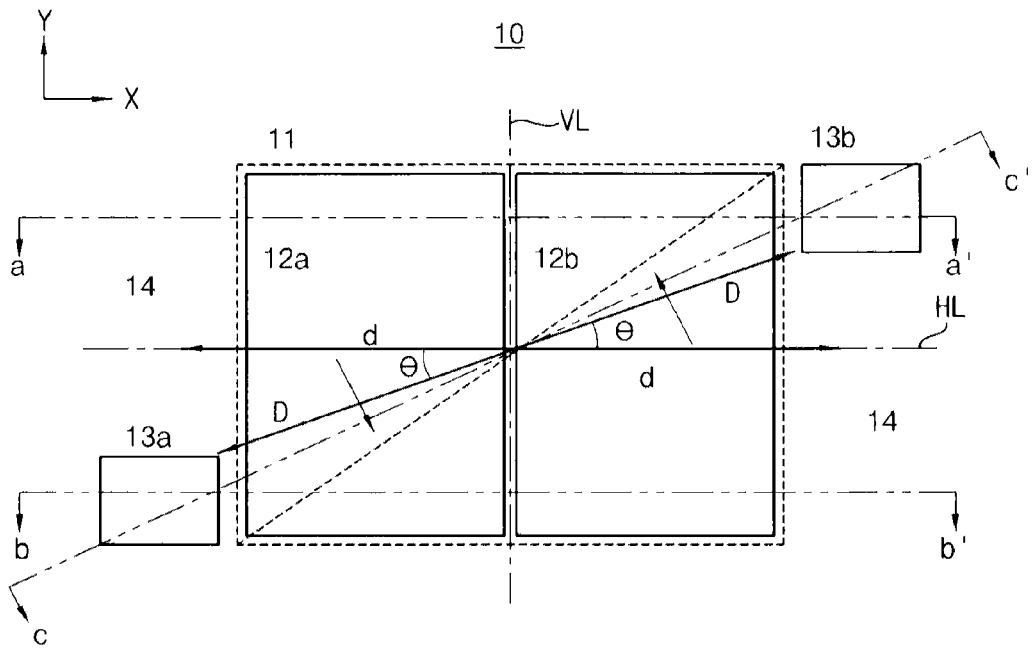
FIG. 1 is a top view of a unit pixel of a depth sensor according to example embodiments.

Various example embodiments will be described more fully hereinafter with reference to the accompanying drawings, in which some example embodiments are shown. Inventive concepts may, however, be embodied in many different forms and should not be construed as limited to the example embodiments set forth herein. Rather, these example embodiments are provided so that this disclosure will be thorough and complete, and will fully convey the scope of inventive concepts to those skilled in the art. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of inventive concepts. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of inventive concepts. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a top view of a unit pixel of a depth sensor according to example embodiments.

Referring to FIG. 1, a unit pixel 10 of a depth sensor includes a light-receiving region 11 (e.g. a photodiode), isolation regions 14 and two sensing regions 13a and 13b. The light-receiving region 11 may also be referred to as a light-receiver. The two sensing regions 13a and 13b may also be referred to as sensors. The light-receiving region 11 performs photoelectric conversion of an incident light to output an electrical signal, and the two sensing regions 13a and 13b are disposed adjacent to the light-receiving region 11 to receive the electrical signal from the light-receiving region 11. The unit pixel 10 may further include two photo gates 12a and 12b disposed on the light-receiving region 11.

Though not illustrated in FIG. 1, the unit pixel 10 may further include a transfer unit and/or an amplification unit to transfer and amplify the electrical signal from the sensing regions 13a and 13b. For example, when the depth sensor is manufactured by complementary metal oxide semiconductor (CMOS) process, the unit pixel 10 may further include a source follower transistor to amplify the electrical signal from the sensing regions 13a and 13b, a circuit to reset the sensing regions 13a and 13b, and a circuit to select the unit pixel among a plurality of unit pixels.

The light-receiving region 11 performs photoelectric conversion of an incident light to output an electrical signal. The sensing regions 13a and 13b are disposed adjacent to the light-receiving region 11 to receive the electrical signal from the light-receiving region 11. A line connecting the sensing regions 13a and 13b forms an angle θ greater than zero degree with respect to a first virtual line HL, where the first virtual line HL passes through a center of the light-receiving region 11 in a horizontal direction X. If sensing regions are disposed symmetrically, the angle between the line connecting the sensing regions and the first virtual line HL will be zero degree. In contrast, the sensing regions 13a and 13b in FIG. 1 are asymmetrical with respect to the first virtual line HL and a second virtual line VL, where the second virtual line VL passes through the center of the light-receiving region 11 in a vertical direction Y perpendicular to the horizontal direction X. The line connecting the sensing regions may form the angle θ between zero degree and forty-five degrees with respect to the first virtual line HL. Through such asymmetric disposition of the sensing regions 13a and 13b, the interval between the sensing regions 13a and 13b may be increased in comparison with the symmetric case. When the two sensing regions 13a and 13b operate complementarily, the effect of the disabled sensing region on the enabled sensing region may be reduced by increasing the interval between the sensing regions 13a and 13b. In other words, the reduction of the lateral field between the one sensing region 13a and the light-receiving region 11 due to the other sensing region 13b may be decreased, thereby enhancing the transfer efficiency of photo charge.

The two sensing regions 13a and 13b may operate complementarily and one of the sensing regions 13a and 13b may be configured to drain the photo charge. The draining of the photo charge may reduce the charge saturation in the sensing region and thus may contribute to realizing a wide dynamic range (WDR) of the depth sensor.

When the distance along the horizontal direction X is d from the center of the light-receiving region 11, the length of the line connection the sensing regions 13a and 13b is 2D=2d/cosθ, which is greater than 2d of the symmetric case. The asymmetry of the sensing regions 13a and 13b may be varied depending on the angle θ.

The two separate photo gates 12a and 12b are illustrated in FIG. 1 as an example, and the one photo gate and three or more photo gates may be disposed in other embodiments. The photo gates 12a and 12b control a transfer of the electrical signal to the sensing regions 13a and 13b depending on voltages applied to the photo gates 12a and 12b.

Figure 2A:
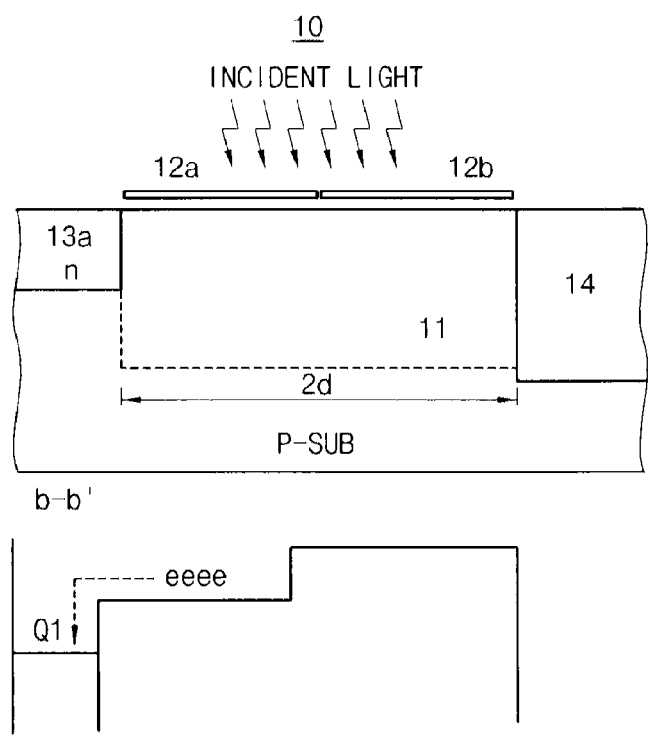
FIG. 2A is a cross-sectional view of the unit pixel of FIG. 1 taken along line b-b'.

FIG. 2A is a cross-sectional view of the unit pixel of FIG. 1 taken along line b-b'.

Referring to FIG. 2A, the light-receiving region 11 may be formed in a p-type substrate P-SUB. The light-receiving region 11 may be formed by implanting p-type impurities, which have the same conduction type as the substrate. The light-receiving region 11 may include multiple layers of n-type impurities and p-type impurities. The photo gates 12a and 12b are formed on the light-receiving region 11. The n-type sensing region 13a is disposed to the left of the light-receiving region 11 and the isolation region 14 is disposed to the right of the light-receiving region 11.

The material of the photo gates 12a and 12b may be changed according to the light penetrating through the photo gates 12a and 12b. For example, a transparent and conductive material such as ITO may be used to transmit the visible light in case of the image pixel for providing the image information and the opaque material such as polysilicon may be used to transmit the infrared light in case of the depth pixel for providing the distance information.

Photo charge is generated in the light-receiving region 11 by the incident light. The size and shape of the space charge region, in which the generated photo charge is collected, may be varied according to the structure of the light-receiving region 11. The electrical potential is illustrated at the bottom portion of FIG. 2A, which represents the case when the positive voltage is applied to the left photo gate 12a. When the positive voltage is applied to the photo gate 12a, the positive holes are repelled to the substrate P-SUB and the negative electrons are collected near the upper surface of the light-receiving region 11 under the photo gate 12a. The potential gradation, that is, the lateral field is caused due to the difference of the impurity density and the applied voltage, and thus the photo electrons e move to the sensing region 13a and the accumulated charge Q1 corresponds to the electrical signal.

Figure 2B:
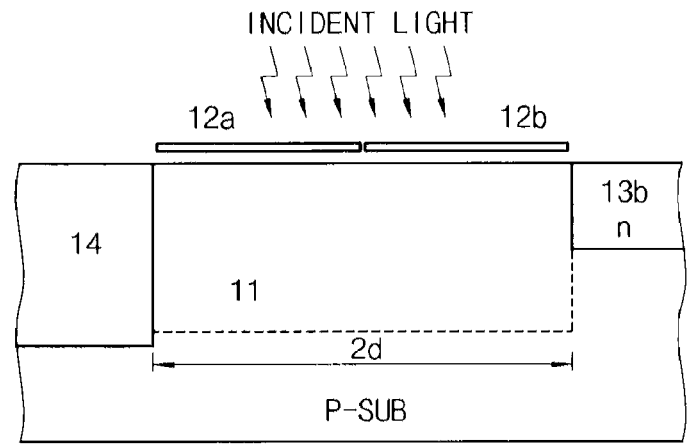
FIG. 2B is a cross-sectional view of the unit pixel of FIG. 1 taken along line a-a'.

FIG. 2B is a cross-sectional view of the unit pixel of FIG. 1 taken along line a-a'.

Referring to FIG. 2B, the light-receiving region 11 may be formed in the p-type substrate P-SUB, and the photo gates 12a and 12b are formed on the light-receiving region 11. The n-type sensing region 13b is disposed to the right of the light-receiving region 11 and the isolation region 14 is disposed to the left of the light-receiving region 11.

The electrical potential is illustrated at the bottom portion of FIG. 2B, which represents the case when the positive voltage is applied to the right photo gate 12b. When the positive voltage is applied to the photo gate 12b, the positive holes are repelled to the substrate P-SUB and the negative electrons are collected near the upper surface of the light-receiving region 11 under the photo gate 12b. The potential gradation, that is, the lateral field is caused due to the difference of the impurity density and the applied voltage, and thus the photo electrons e move to the sensing region 13b and the accumulated charge Q2 corresponds to the electrical signal.

Figure 2C:
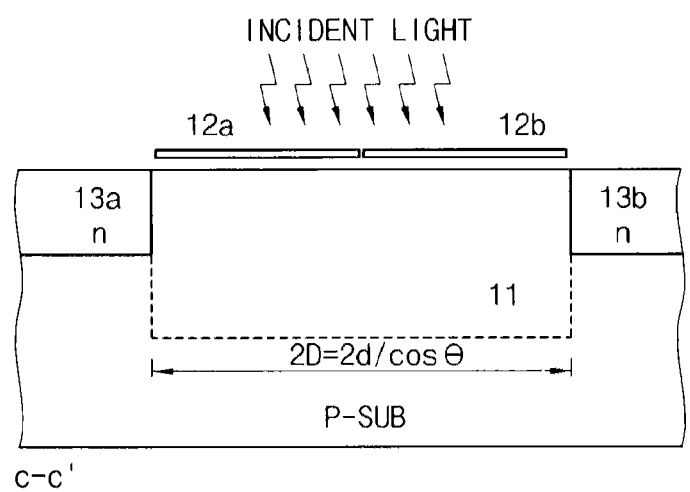
FIG. 2C is a cross-sectional view of the unit pixel of FIG. 1 taken along line c-c'.
Figure 2C:
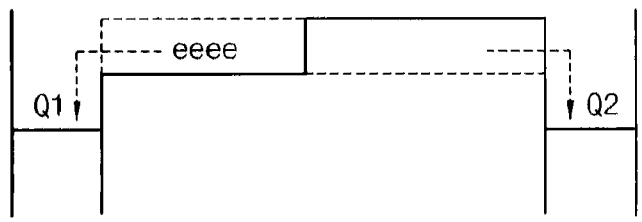

FIG. 2C is a cross-sectional view of the unit pixel of FIG. 1 taken along line c-c'.

Referring to FIG. 2C, both of the sensing regions 13a and 13b may be shown by cutting the unit pixel 10 along the line connecting the sensing regions 13a and 13b. The electrical potentials of the two cases are illustrated at the bottom portion of FIG. 2C. The solid line represents the case when the positive voltage is applied to the left photo gate 12a and the dashed line represents the case when the positive voltage is applied to the right photo gate 12b. As mentioned above, the charges Q1 and Q2 may be accumulated respectively in the sensing regions 13a and 13b by controlling the voltages applied to the photo gates 12a and 12b. The interval 2D between the asymmetric sensing regions 13a and 13b may be increased by 1/cos θ compared with 2d of symmetric case as understood with reference to FIGS. 1, 2A, 2B and 2C.

Figure 3:
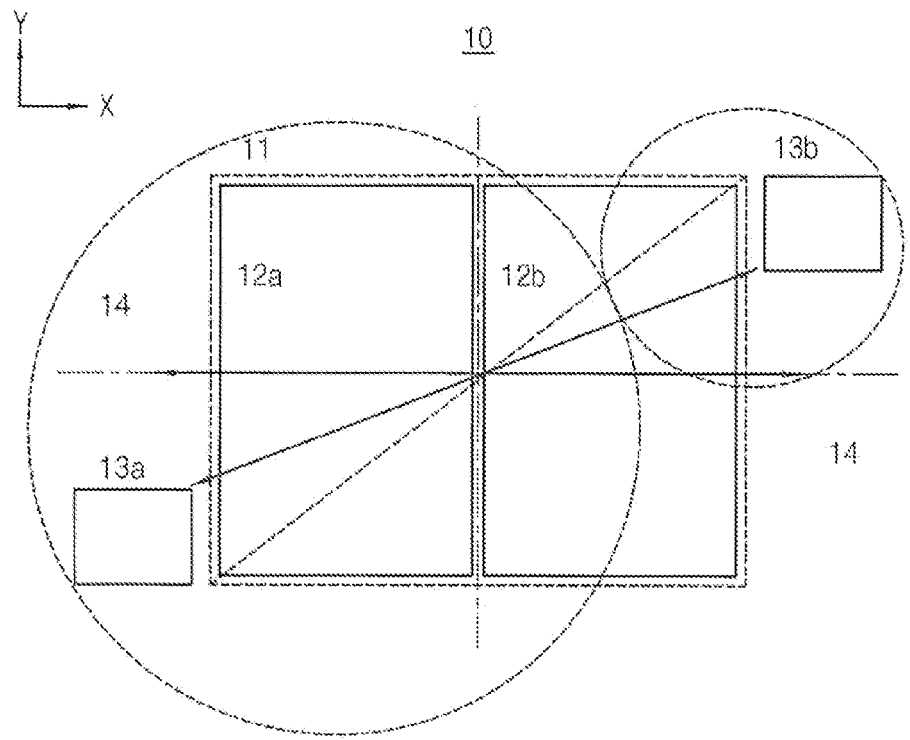
FIG. 3 is a diagram for describing an effect due to asymmetry of the unit pixel of FIG. 1.

FIG. 3 is a diagram for describing an effect due to asymmetry of the unit pixel of FIG. 1.

The two circles in FIG. 3 represent the iso-potential surfaces when the positive voltage is applied to the left photo gate 12a. The capability of each sensing region of attracting the electrons is proportion to a volume within each iso-potential surface. Thus the effect of the static field of the disabled sensing region 13b on the lateral field to the enabled sensing region 13a may be reduced by increasing the interval between the sensing regions 13a and 13b.

Figure 4:
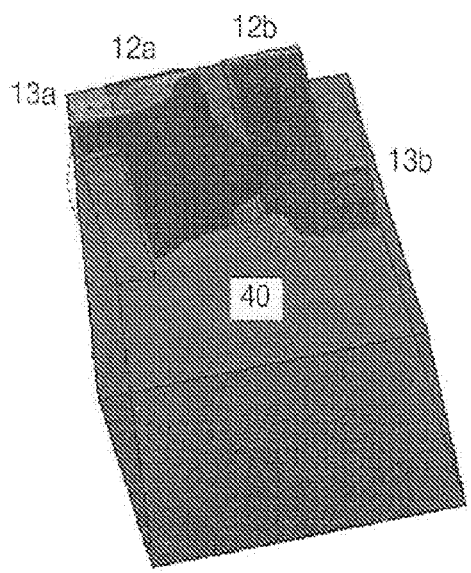
FIG. 4 is a diagram illustrating three-dimensionally isopotential surfaces in FIG. 3.

FIG. 4 is a diagram illustrating three-dimensionally the iso-potential surfaces in FIG. 3.

The iso-potential distribution is shown in FIG. 4 when the unit pixel is seen through the substrate 40 from the bottom. As mentioned above, the effect of the static field of the disabled sensing region 13b on the lateral field to the enabled sensing region 13a may be reduced by increasing the interval between the sensing regions 13a and 13b, that is, by disposing the sensing regions 13a and 13b asymmetrically. As a result, a demodulation contrast (DC), which is typically used as representing the performance of the time-of-flight (TOF) depth sensor, may be enhanced.

Figure 5:
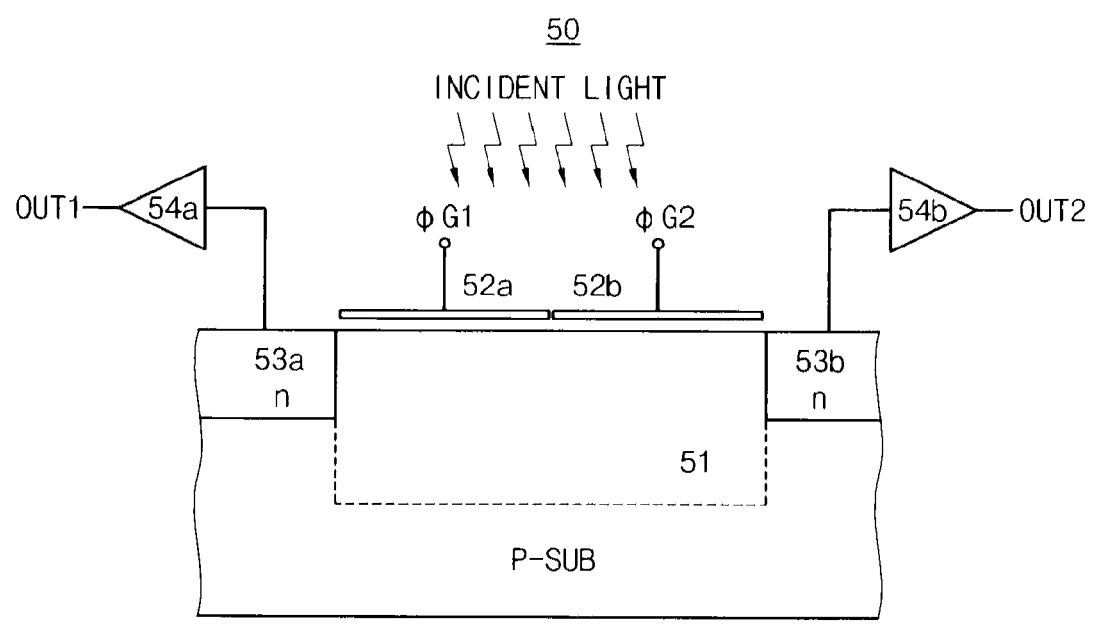
FIG. 5 is a conceptual diagram of a unit pixel of a depth sensor according to example embodiments.

FIG. 5 is a conceptual diagram of a unit pixel of a depth sensor according to example embodiments.

As described with reference to FIGS. 1 and 2C, FIG. 5 illustrates the cross-sectional view of a unit pixel 50 taken along line c-c' of FIG. 1. Referring to FIG. 5, a light-receiving region 51 is disposed in a p-type substrate P-SUB and a two sensing regions 53a and 53b are disposed to both sides of the light-receiving region 51. Two photo gates 52a and 52b are controlled by respective control signals ΦG1 and ΦG2. The control signals ΦG1 and ΦG2 may be complementarily-activated signals to transfer the photo electrons generated in the light-receiving region 51 alternatively to the sensing regions 53a and 53b. The charges accumulated in the respective sensing regions 53a and 53b are provided as output signals OUT1 and OUT2 through transfer-amplification circuits 54a and 54b.

When only one of the sensing regions 53a and 53b is used to sense the photo electrons and the other is used to drain the photo electrons, the corresponding transfer-amplification circuit may be omitted and the drain voltage is applied to the draining sensing region. For example, when the left sensing region 53a is used to sense the photo electrons, the transfer-amplification circuit 54b coupled to the right sensing region 53b may be omitted and the power supply voltage VDD as the drain voltage may be applied to the right sensing region 53b.

Also the unit pixel may be formed using an n-type substrate. In this case, the negative voltage is applied to sense photo holes instead of the photo electrons and the ground voltage VSS may be applied to the draining sensing region.

Figure 6:
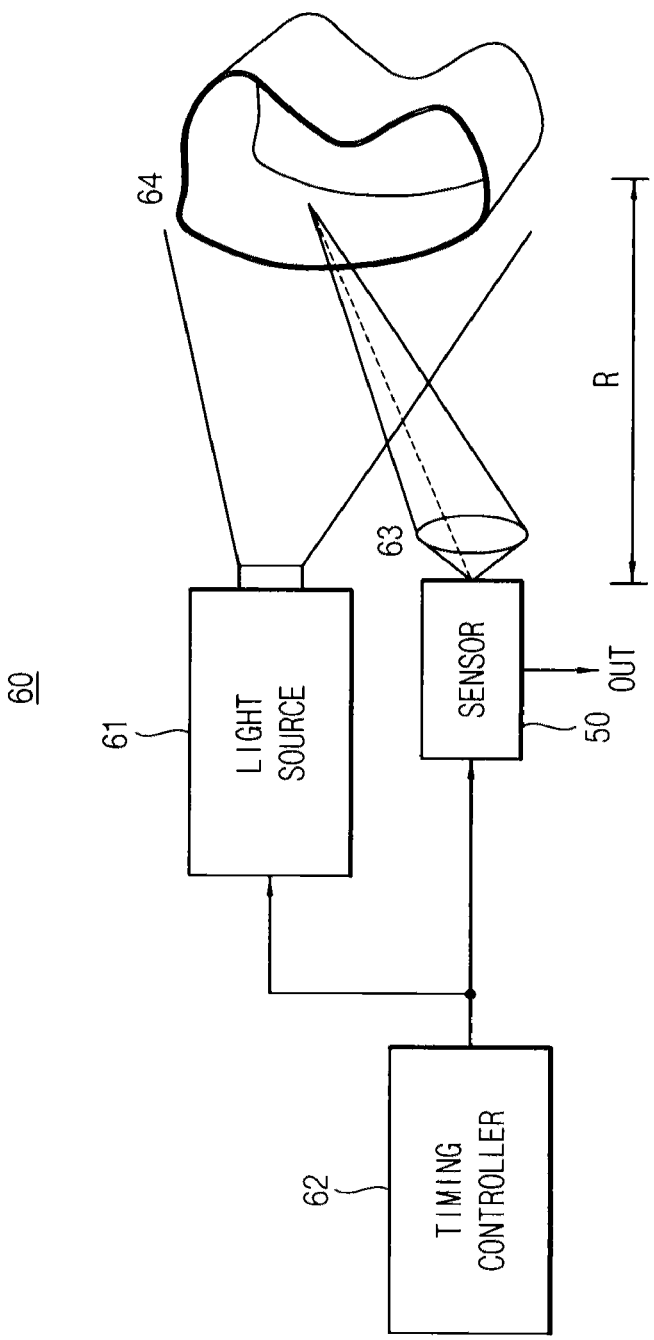
FIG. 6 is a diagram illustrating a distance measurement system according to example embodiments.

FIG. 6 is a diagram illustrating a distance measurement system according to example embodiments.

Referring to FIG. 6, the distance measurement system 60 may include a light source 61, a timing controller 62, a depth sensor 50 and an optical lens 63. The light source 61 may illuminate a light to an object 64. The light source 61 may include a light-emitting diode (LED). The timing controller 62 controls the operational timings of the light source 61 and the depth sensor 50. The light from the light source 61 is reflected by the object 64 and the reflected light is input as the incident light to the depth sensor 50 through the optical lens 63. The depth sensor 50 includes the pixels according to example embodiments as described with reference to FIGS. 1 through 5. As mentioned above, the demodulation contrast of the depth sensor may be enhanced through the asymmetry of the sensing regions. The depth sensor outputs the distance information corresponding to the distance R to the object 64 using the asymmetrical sensing regions. The timing controller 62 may synchronize the light output timing of the light source 61 and the operational timing of the depth sensor 50.

Figure 7A:
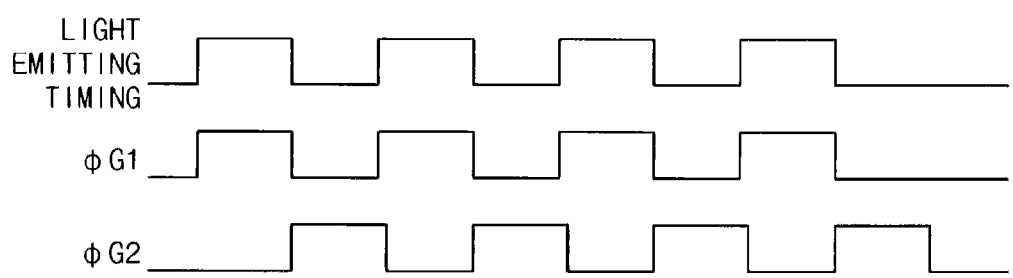
FIG. 7A is a timing diagram illustrating timings of outputting a light from the light source in FIG. 6 and controlling the photo gates in FIG. 5.
Figure 7B:
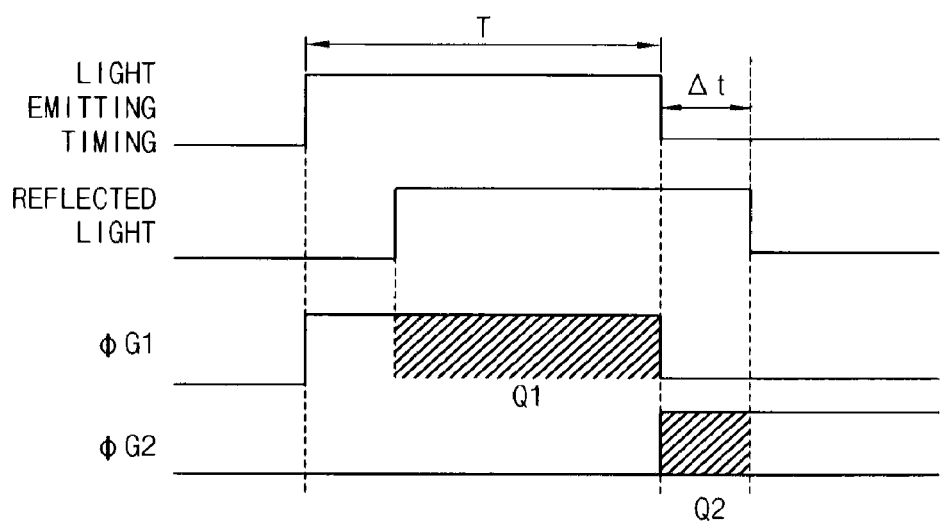
FIG. 7B is a diagram illustrating an operation of a depth sensor of time-of-flight type.

FIG. 7A is a timing diagram illustrating timings of outputting a light from the light source in FIG. 6 and controlling the photo gates in FIG. 5, and FIG. 7B is a diagram illustrating an operation of a depth sensor of time-of-flight (TOF) type.

Referring to FIG. 7A, the light output from the light source is synchronized with the light emitting timing signal. The first photo gate control signal ΦG1 has substantially the same frequency as the light emitting timing signal and the first photo gate control signal ΦG1 is synchronized with the light emitting timing signal. The second photo gate signal ΦG2 has a phase difference of 180 degrees with respect to the first photo gate control signal ΦG1. The output light from the light source may have the same waveform as the light emitting timing signal. The signals of square waveform are illustrated in FIG. 7A as an example, and the signals may have other waveforms such as sinusoidal waves in other embodiments.

Referring to FIG. 7B, T indicates the on-time of the photo gate and Δt indicates the time difference between the reflected light from the object 64 and the output light from the light source 61, that is, the light emitting timing signal. Q1 and Q2 are photo charges measured using the complementary photo gate control signals ΦG1 and ΦG2. The photo charges Q1 and Q2 may be measured sequentially using one sensing region, or may be measured respectively by the two asymmetrical sensing regions as illustrated in FIG. 1. The time difference Δt may be calculated based on the measured photo charges Q1 and Q2. For example, the difference between the measured charges Q1 and Q2 may be used to obtain the time difference Δt. Accordingly the distance R to the object 64 may be obtained using the relation Δt=2R/c, where c is the light velocity.

Figure 8:
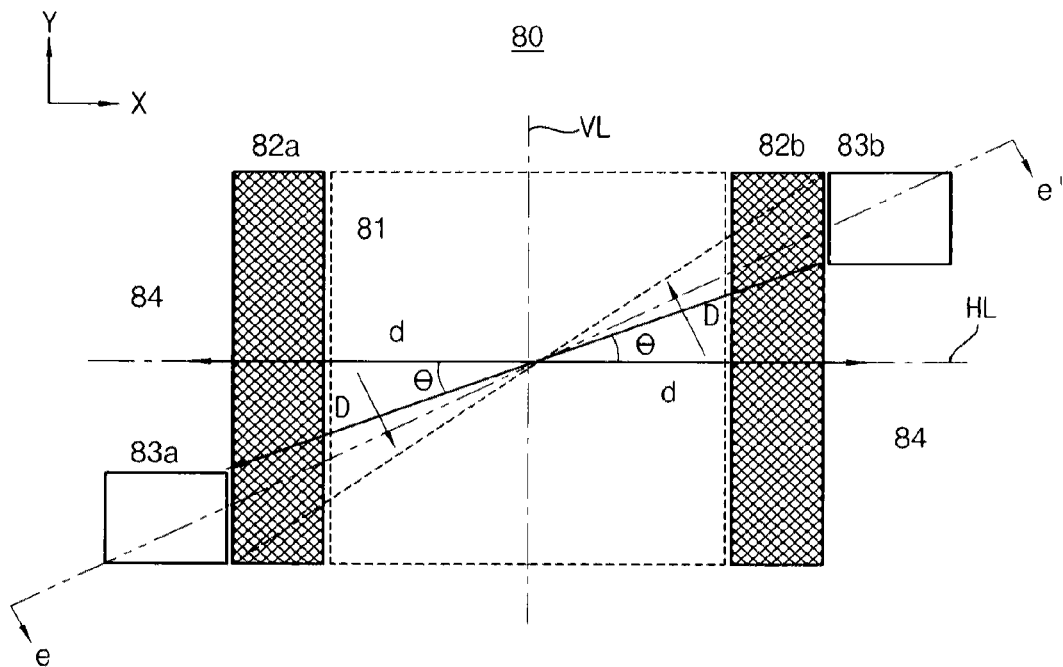
FIG. 8 is a top view of a unit pixel of a depth sensor according to example embodiments.

FIG. 8 is a top view of a unit pixel of a depth sensor according to example embodiments.

Referring to FIG. 8, a unit pixel 80 of a depth sensor includes a light-receiving region 81 (e.g. a photodiode), isolation regions 84 and two asymmetrical sensing regions 83a and 83b. The light-receiving region 81 performs photoelectric conversion of an incident light to output an electrical signal, and the two sensing regions 83a and 83b are disposed adjacent to the light-receiving region 81 to receive the electrical signal from the light-receiving region 81.

In comparison with the unit pixel 10 of FIG. 1, the photo gates are omitted and transfer gates 82a and 82b are further included in the unit pixel 80 of FIG. 8. As will be described with reference to FIG. 10, the photo gates may be added to the unit pixel 80 of FIG. 8. Though not illustrated in FIG. 8, the unit pixel 80 may further include a transfer unit and/or an amplification unit to transfer and amplify the electrical signal from the sensing regions 83a and 83b.

The sensing regions 83a and 83b are disposed adjacent to the light-receiving region 81 to receive the electrical signal from the light-receiving region 81. A line connecting the sensing regions 83a and 83b forms an angle θ greater than zero degree with respect to a first virtual line HL, where the first virtual line HL passes through a center of the light-receiving region 81 in a horizontal direction X. If sensing regions are disposed symmetrically, the angle between the line connecting the sensing regions and the first virtual line HL will be zero degree. In contrast, the sensing regions 83a and 83b in FIG. 8 are asymmetrical with respect to the first virtual line HL and a second virtual line VL, where the second virtual line VL passes through the center of the light-receiving region 81 in a vertical direction Y perpendicular to the horizontal direction X. The line connecting the sensing regions may form the angle θ between zero degree and forty-five degrees with respect to the first virtual line HL. Through such asymmetric disposition of the sensing regions 83a and 83b, the interval between the sensing regions 83a and 83b may be increased in comparison with the symmetric case. When the two sensing regions 83a and 83b operate complementarily, the effect of the disabled sensing region on the enabled sensing region may be reduced by increasing the interval between the sensing regions 83a and 83b. In other words, the reduction of the lateral field between the one sensing region 83a and the light-receiving region 81 due to the other sensing region 83b may be decreased, thereby enhancing the transfer efficiency of photo charge.

The two sensing regions 83a and 83b may operate complementarily and one of the sensing regions 83a and 83b may be configured to drain the photo charge. When the distance along the horizontal direction X is d from the center of the light-receiving region 81, the length of the line connection the sensing regions 83a and 83b is 2D=2d/cosθ, which is greater than 2d of the symmetric case. The asymmetry of the sensing regions 83a and 83b may be varied depending on the angle θ.

Figure 9:
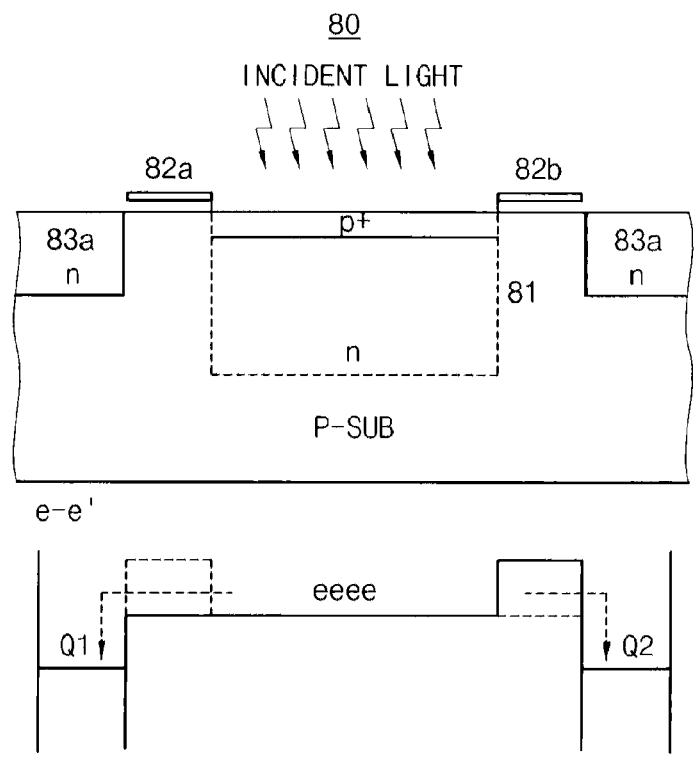
FIG. 9 is a cross-sectional view of the unit pixel of FIG. 8 taken along line e-e'.

FIG. 9 is a cross-sectional view of the unit pixel of FIG. 8 taken along line e-e'.

Referring to FIG. 9, both of the sensing regions 83a and 83b may be shown by cutting the unit pixel 80 along the line connecting the sensing regions 83a and 83b. The light-receiving region 81 may include an n-type well (n) and a pinning layer (p+) on the n-type well. The electrical potentials of the two cases are illustrated at the bottom portion of FIG. 8. The solid line represents the case when the positive voltage is applied to the left photo gate 82a and the dashed line represents the case when the positive voltage is applied to the right photo gate 82b. As mentioned above, the charges Q1 and Q2 may be accumulated respectively in the sensing regions 83a and 83b by controlling the voltages applied to the photo gates 82a and 82b.

Figure 10:
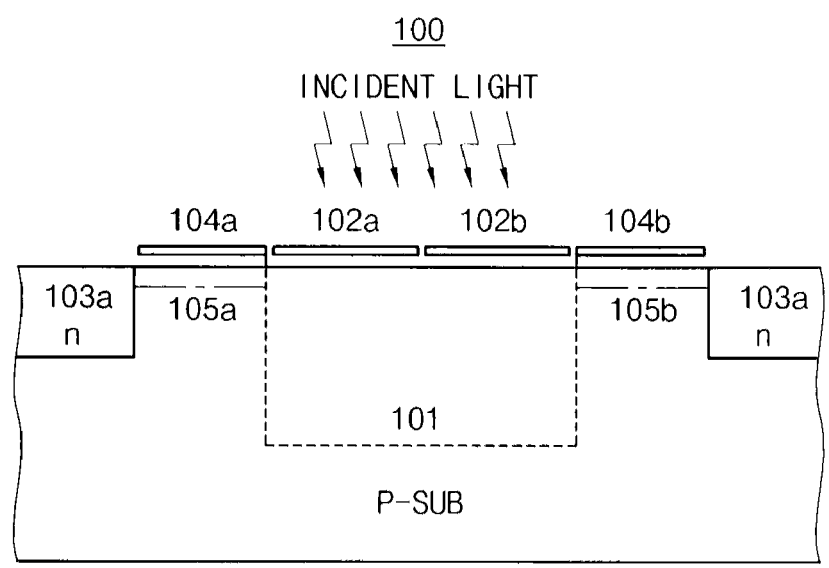
FIG. 10 is a cross-sectional view of a unit pixel of a depth sensor according to example embodiments.

FIG. 10 is a cross-sectional view of a unit pixel of a depth sensor according to example embodiments.

Referring to FIG. 10, the light-receiving region 101 is disposed in a p-type substrate P-SUB. The photo gates 102a and 102b are disposed on the light-receiving region 101, and the transfer gates 104a and 104b are disposed on regions between the light-receiving region 101 and the sensing regions 103a and 103b.

In comparison with the unit pixel 80 of FIG. 9, the two photo gates 102a and 102b are further included in the unit pixel 100 of FIG. 10. The photo charges collected under the photo gates 102a and 102b are transferred respectively to the sensing regions 103a and 103b through the channels 105a and 105b formed depending on the on-off operations of the transfer gates 104a and 104b. As mentioned above, through the asymmetric disposition of the sensing regions 103a and 103b, the interval between the sensing regions 103a and 103b may be increased in comparison with the symmetric case. Interference between the sensing regions 103a and 103b may be reduced and thus the transfer efficiency of photo charge and the demodulation contrast may be enhanced.

Figure 11:
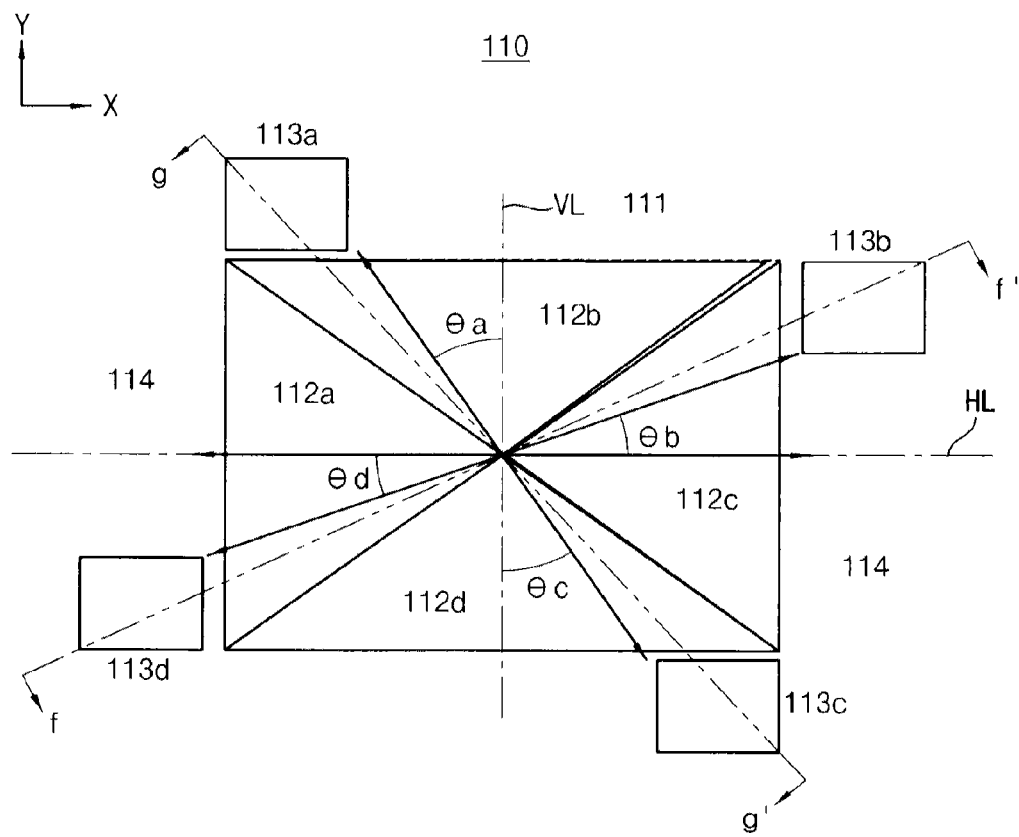
FIG. 11 is a top view of a unit pixel of a depth sensor according to example embodiments.

FIG. 11 is a top view of a unit pixel of a depth sensor according to example embodiments.

Referring to FIG. 11, a unit pixel 110 of a depth sensor includes a light-receiving region 111, isolation regions 114 and two asymmetric sensing regions 113b and 13d near the left and right sides of the light-receiving region 111, two asymmetric sensing regions 113a and 113c near the upper and bottom sides of the light-receiving region 111 and four photo gates 112a, 112b, 112c and 112d disposed on the light-receiving region 111.

A line connecting the two sensing regions 113b and 113d forms angles θb and θd greater than zero degree with respect to the first virtual line HL, If the sensing regions 113b and 113d are disposed symmetrically, the angles between the line connecting the sensing regions 113b and 113d and the first virtual line HL will be zero degree. The line connecting the sensing regions 113b and 113d may form the angles θb and θd between zero degree and forty-five degrees with respect to the first virtual line HL.

A line connecting the two sensing regions 113a and 113c forms angles θa and θc greater than zero degree with respect to the second virtual line VL, If sensing regions 113a and 113c are disposed symmetrically, the angles between the line connecting the sensing regions 113a and 113c and the second virtual line VL will be zero degree. The line connecting the sensing regions 113a and 113c may form the angles θa and θc between zero degree and forty-five degrees with respect to the second virtual line VL.

The sensing regions 113a, 113b, 113c and 113d are disposed asymmetrically with respect to the first virtual line HL and the second virtual line VL. Through such asymmetric disposition of the sensing regions, the interval between the sensing regions 113a and 113c and the interval between the sensing regions 113b and 113d may be increased in comparison with the symmetric case. When the sensing regions 113a through 113d operate complementarily, the effect of the disabled sensing region on the enabled sensing region may be reduced by increasing the interval between the sensing regions. In other words, the reduction of the lateral field between the one sensing region and the light-receiving region due to the other sensing region may be decreased, thereby enhancing the transfer efficiency of photo charge.

The sensing regions 113a through 113d may be enabled sequentially using control signals having a predetermined phase difference, and at least one of the sensing regions 113a through 113d may be configured to drain the photo charge. The draining of the photo charge may reduce the charge saturation in the sensing region and thus may contribute to realizing a wide dynamic range (WDR) of the depth sensor.

The four separate photo gates 112a through 112d are illustrated in FIG. 11 as an example, and the different number of photo gates may be disposed in other embodiments. The photo gates 112a through 112d control a transfer of the electrical signal to the sensing regions 113a through 113d depending on voltages applied to the photo gates 112a through 112d.

Figure 12:
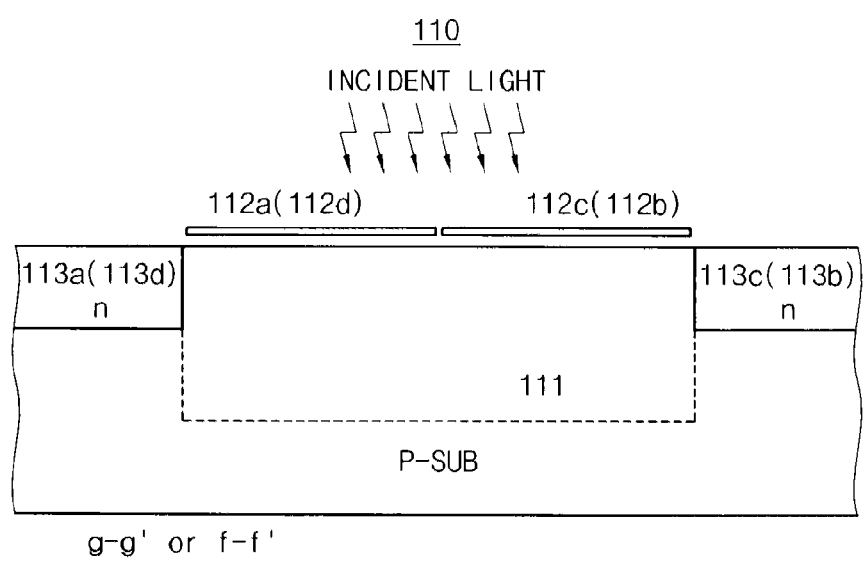
FIG. 12 is a cross-sectional view of the unit pixel of FIG. 11 taken along line f-f' or line g-g'.

FIG. 12 is a cross-sectional view of the unit pixel of FIG. 11 taken along line f-f' or line g-g'.

Referring to FIG. 12, both of the sensing regions 113a and 113c (or 113b and 113d) may be shown by cutting the unit pixel 110 along the line connecting the sensing regions 113a and 113c (or 113b and 113d). As mentioned above, the charge transfer to the sensing regions 113a and 113c (or 113b and 113d) may be controlled by controlling the voltages applied to the photo gates 112a and 112c (or 112b and 112d).

Figure 13:
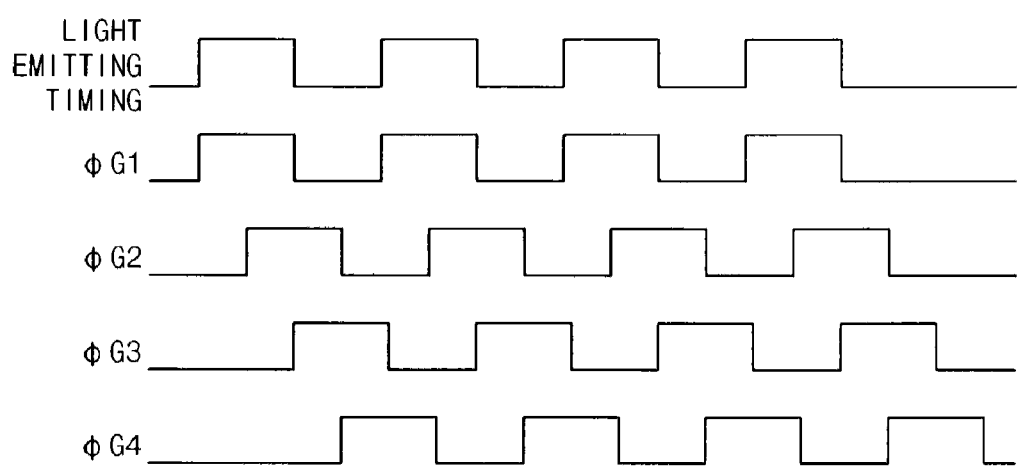
FIG. 13 is a timing diagram illustrating an operation of a depth sensor adopting a pixel structure according to example embodiments.

FIG. 13 is a timing diagram illustrating an operation of a depth sensor adopting an asymmetric pixel structure according to example embodiments. The unit pixel 110 illustrated in FIGS. 11 and 12 may be controlled using control signals illustrated in FIG. 13.

Referring to FIG. 13, the light output from the light source is synchronized with the light emitting timing signal. The first photo gate control signal ΦG1 has substantially the same frequency as the light emitting timing signal and the first photo gate control signal ΦG1 is synchronized with the light emitting timing signal. The second photo gate signal ΦG2 has a phase difference of 90 degrees with respect to the first photo gate control signal ΦG1. The third photo gate control signal ΦG3 has a phase difference of 90 degrees with respect to the second photo gate control signal ΦG2, and the fourth photo gate signal ΦG3 has a phase difference of 90 degrees with respect to the third photo gate control signal ΦG3. The output light from the light source may have the same waveform as the light emitting timing signal.

Figure 14:
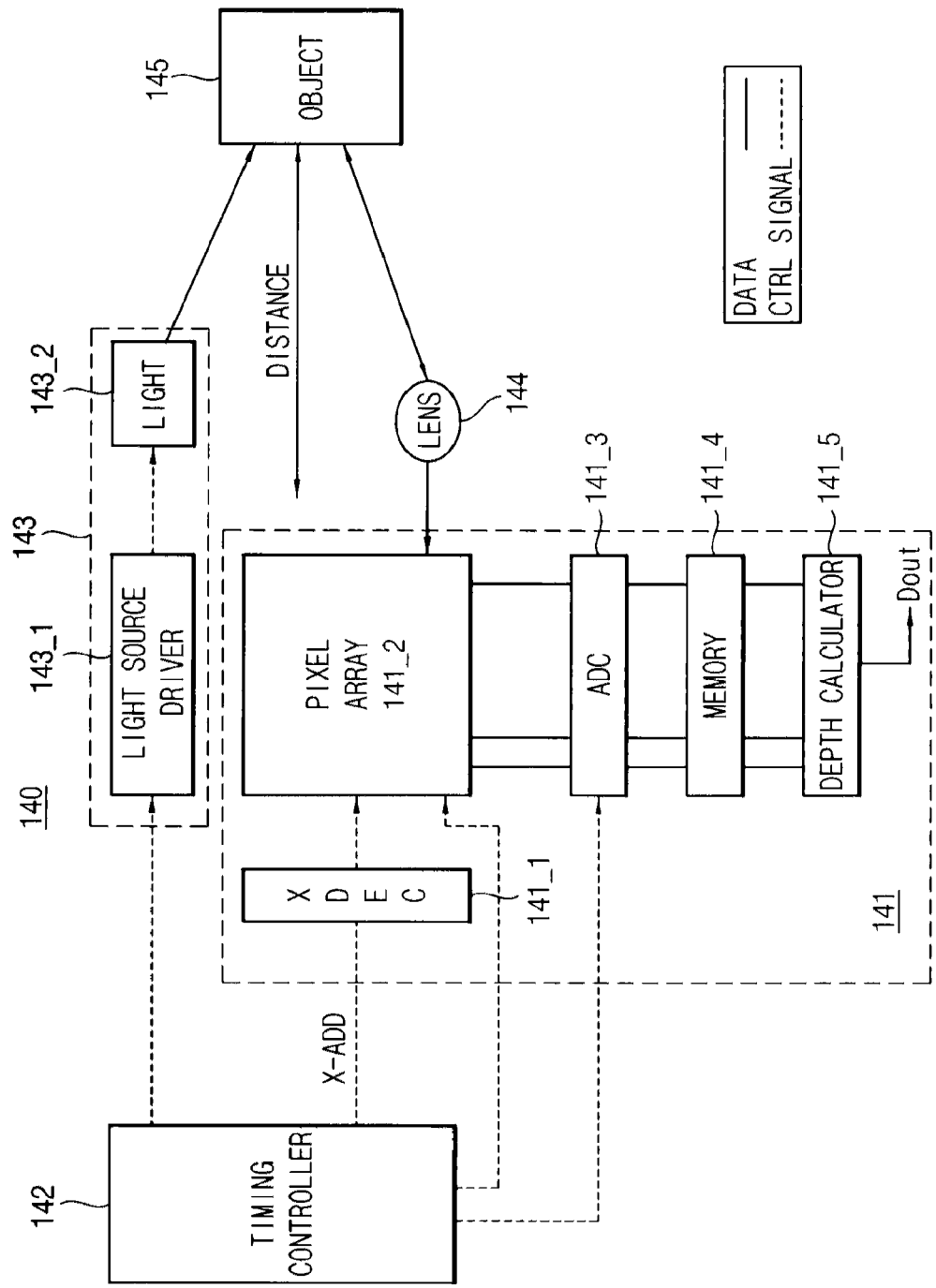
FIG. 14 is a diagram illustrating a depth sensor module according to example embodiments.

FIG. 14 is a diagram illustrating a depth sensor module according to example embodiments.

Referring to FIG. 14, a depth sensor module 140 may include a depth sensor 141, a timing controller 142, a light source 143 and a lens 144. The light from the light source 143 is reflected by the object 145 and the reflected light is input as the incident light to the depth sensor 141 through the lens 144. The depth sensor 141 may have the enhance demodulation contrast using the asymmetric sensing regions in the pixel as described above. The depth sensor 141 converts the optical signals to the electrical signals. The timing controller 142 controls the operational timings of the depth sensor 141 and the light source 143. For example, the timing controller 142 may synchronize the photo gate control signals to the depth sensor 141 with the output light from the light source 143.

The light source 143 may include a light source driver 143_1 and a light generator 143_2. The light source driver 143_1 controls the output timing of the light generator 143_2 in response to the light emitting timing signal from the timing controller 142. The light generator 143_2 may include, for example, a laser diode for generating an infrared light.

The depth sensor 141 may include a row decoder XDEC 141_1, a pixel array 141_2, an analog-to-digital converter (ADC) 141_3, a memory 141_4 and a depth calculator 141_5.

The pixel array 141_2 may have a plurality of unit pixels as described with reference to FIGS. 1 through 13. The ADC 141_3 converts the analog signals from the pixel array 141_2 to the digital signals. The memory 141_4 may be a buffer memory or a frame memory to store the digital signals from the ADC 141_3 by the frame unit. The depth calculator 141_5 calculates the distance to the object 145 using the data stored in the memory 141_4. The row decoder 141_1 selects one row of the pixel array 141_2 and controls the operational timing of the selected row based on the address signal X-ADD from the timing controller 142.

The depth sensor 141 may be a charge coupled device (CCD) type or a CMOS image sensor (CIS) type. The structure illustrated in FIG. 14 is similar to the CIS type, and the connection of the ADC 141_3 may be varied in case of the CCD type.

According to correlated double sampling (CDS) scheme, the ADC 141_3 may have various structures for analog CDS, digital CDS or dual CDS. The ADC_3 may be a column ADC type that each ADC is coupled to each column line or a single ADC type that one common ADC is used for all column lines.

In some embodiments, the depth sensor 141 and the timing controller 142 may be integrated in a single chip. In other embodiments, the depth sensor 141, the timing controller 142 and the lens 144 may be formed into one module and the light source 143 may be formed into another module.

Figure 15:
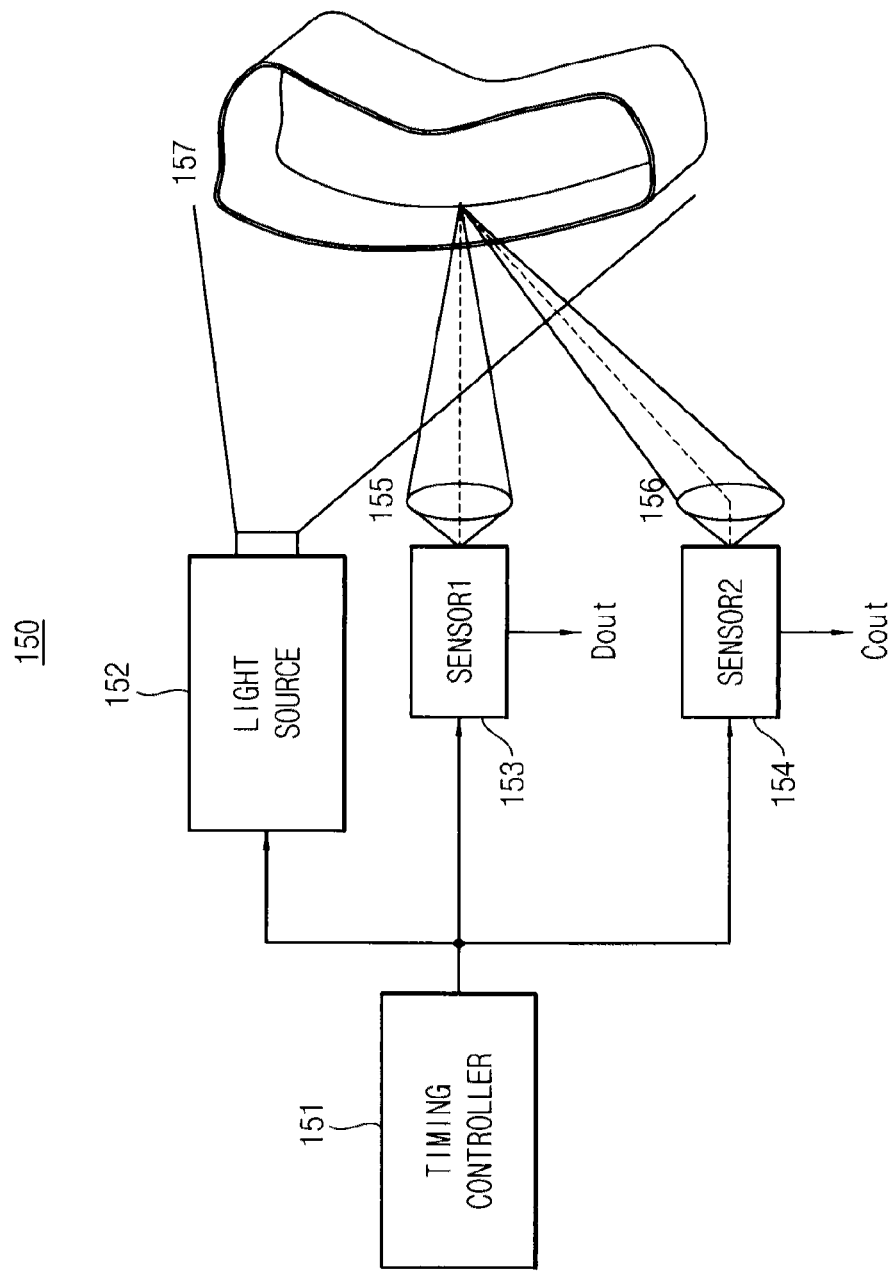
FIGS. 15 and 16 are diagrams illustrating systems of measuring an image and a distance according to example embodiments.
Figure 16:
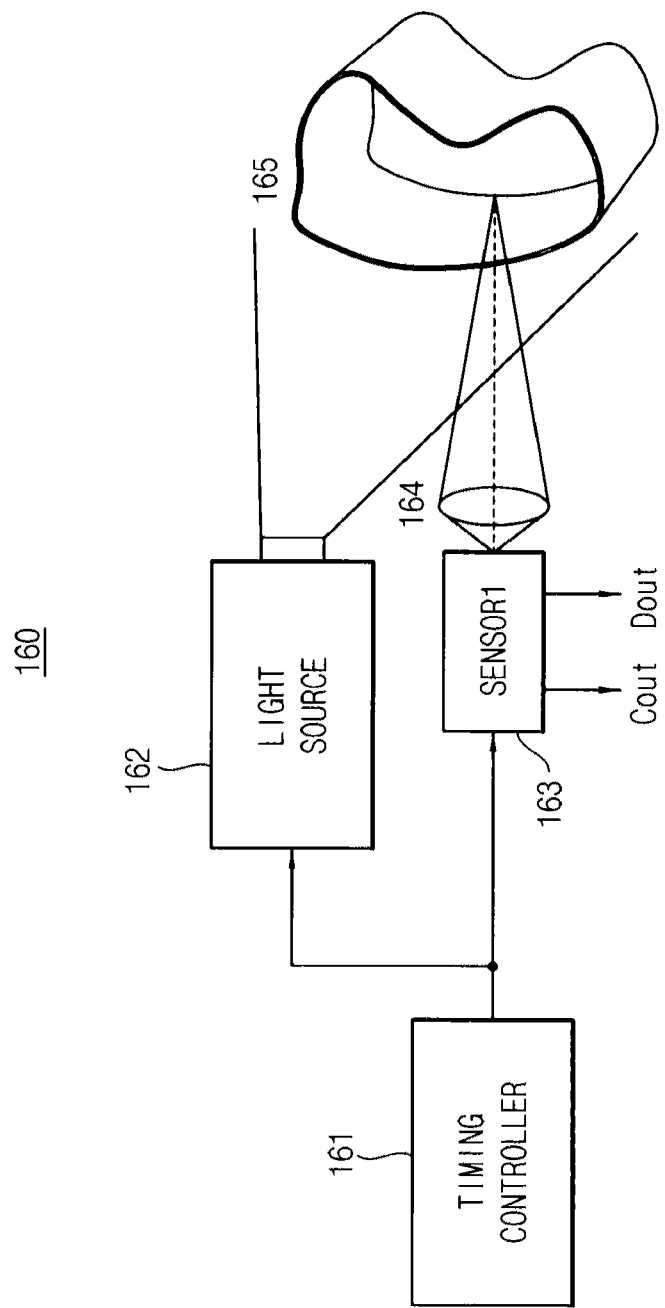

FIGS. 15 and 16 are diagrams illustrating systems of measuring an image and a distance according to example embodiments.

Referring to FIG. 15, a system 150 may include a timing controller 151, a light source 152, a depth sensor 153 for measuring the distance information and an image sensor 154 for measuring the image information. The sensors 153 and 154 may be coupled to respective lenses 155 and 156. The timing controller 151 controls the operational timings of the light source 152 and the sensors 153 and 154.

The depth sensor 153 receives through the lens 155 the incident light, which is output from the light source 152 and reflected by the object 157, and outputs the distance information Dout. The image sensor 154 receives through the lens 156 the optical signals representing the captured image of the object 157 and outputs the image information Cout. The depth sensor 153 and the image sensor 154 may be implemented as the respective chips. The depth sensor 153 includes at least one unit pixel including the asymmetric sensing regions as described with reference to FIGS. 1 through 13.

Referring to FIG. 16, a system 160 may include a timing controller 161, a light source 162 and a three-dimensional image sensor 163 for measuring the distance information in addition to the image information. The lens 164 is coupled to the three-dimensional image sensor 163. The timing controller 161 controls the operational timings of the light source 152 and the three-dimensional image sensor 163.

The three-dimensional image sensor 163 may include a pixel array in which image pixels and depth pixels are arranged in a predetermined pattern. The three-dimensional image sensor 163 outputs the distance information Dout using the depth pixels based on the reflected light from the object 165. In addition, the three-dimensional image sensor 163 outputs the image information Cout using the image pixels based on the optical signals representing the captured image of the object 165. The depth pixel includes the asymmetric sensing regions as described with reference to FIGS. 1 through 13.

Figure 17:
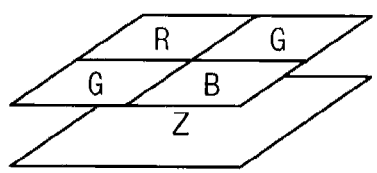
FIG. 17 is a diagram illustrating example layouts of a pixel array included in the three-dimensional image sensor in FIG. 16.
Figure 17:
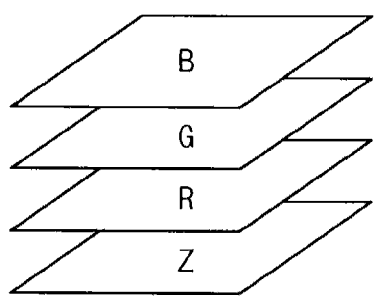

FIG. 17 is a diagram illustrating example layouts of a pixel array included in the three-dimensional image sensor in FIG. 16.

FIG. 17 shows various example patterns (a) through (e) of the pixel array including the depth pixels Z and the image pixels R, G and B, and also other patterns may be adopted to form the pixel array of the three-dimensional image sensor 163 of FIG. 16. The red pixel R, the green pixel G and the blue pixel B are used as the image pixels in FIG. 17 as an example, and alternatively pixels such as a magenta pixel, a cyan pixel, a yellow pixel and a white pixel may be used as the image pixels.

Referring to FIG. 17 (a), a unit pattern of 2*2 matrix may include one depth pixel Z and three color pixels R, G and B, and the pixel array may include a plurality of the unit patterns repeated in the row direction and the column direction.

Referring to FIG. 17 (b), a unit pattern of 3*2 matrix may include two depth pixels Z and Z and the four color pixels R, G, G and B.

Referring to FIG. 17 (c), a pixel array may include image pixels R, G and B arranged in the Bayer pattern and depth pixels four times larger than each image pixel.

Referring to FIG. 17 (d), a pixel array may include an upper layer in which the color pixels R, G and B are arranged in the Bayer pattern and a bottom layer in which the depth pixels Z four times larger than each image pixel are arranged.

Referring to FIG. 17 (e), a pixel array may include four stacked layers in which the three color pixels R, G and B and the depth pixels are arranged, respectively. The layers for the respective pixels may be determined depending on the penetration depths of the corresponding light. For example, the blue pixels B corresponding to the visible light of the shortest wavelength may be formed in the uppermost layer, and the depth pixel Z corresponding to the infrared light of the longest wavelength may be formed in the lowest layer.

FIGS. 18 through 23 are circuit diagrams illustrating a unit pixel of a depth sensor according to example embodiments.

Figure 18:
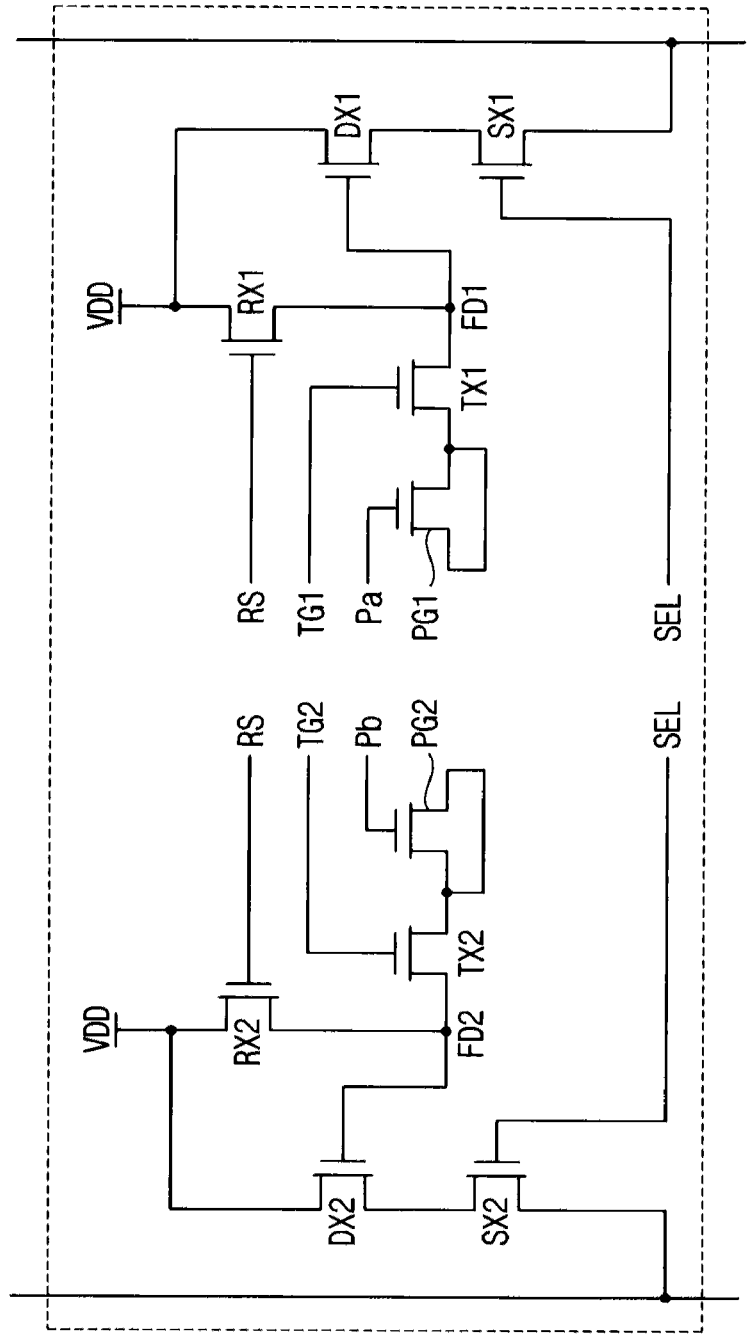
FIGS. 18 through 23 are circuit diagrams illustrating a unit pixel of a depth sensor according to example embodiments.

Two paired pixels are illustrated in FIG. 18. The pixels include photo gates PG1 and PG2 responding to gate control signals Pa and Pb, transfer transistors TX1 and TX2 responding to transfer control signals TG1 and TG2, sensing regions FD1 and FD2, reset transistors RX1 and RX2 responding to a reset signal RS, drive transistors DX1 and DX2, and selection transistors SX1 and SX2 responding to a selection signal SEL, respectively.

In some example embodiments, each pixel may include its own light-receiving region (not shown). In this case, each pixel may include two asymmetric sensing regions as described with reference to FIGS. 1 through 13, but only one sensing region per pixel is illustrated in FIG. 18 for convenience of description. The illustrated sensing region FD1 or FD2 is used for sensing and not-illustrated sensing region may be used for draining to realize wide dynamic range (WDR).

In other example embodiments, the two pixels in FIG. 18 may share one light-receiving region (not shown). In this case, the photo gates PG1 and PG2 are separated to operate complementarily and the two sensing regions FD1 and FD2 may be disposed asymmetrically near the light-receiving region.

Figure 19:
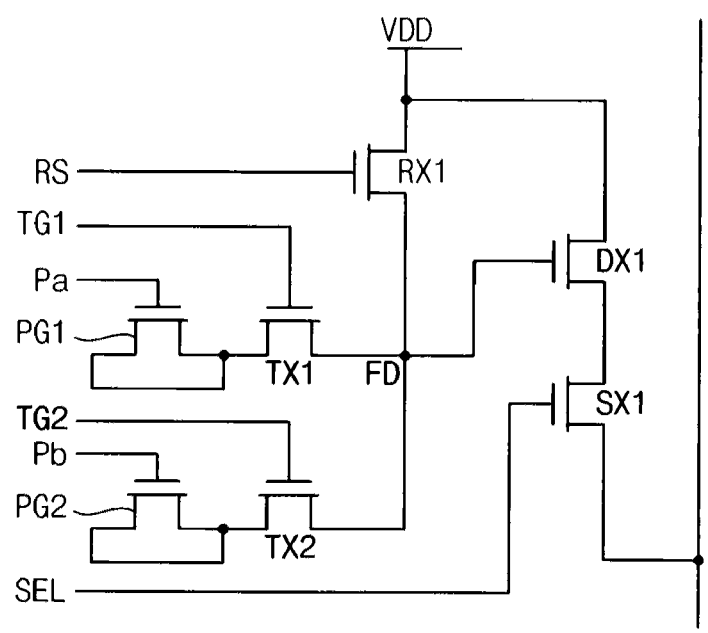

Referring to FIG. 19, the two pixels may share the light-receiving region (not shown), the sensing region FD, the reset transistor RX1, the drive transistor DX1 and the selection transistor SX1. As mentioned above, the not-illustrated sensing region for draining may be disposed asymmetrically the sensing region FD near the light-receiving region.

Figure 20:
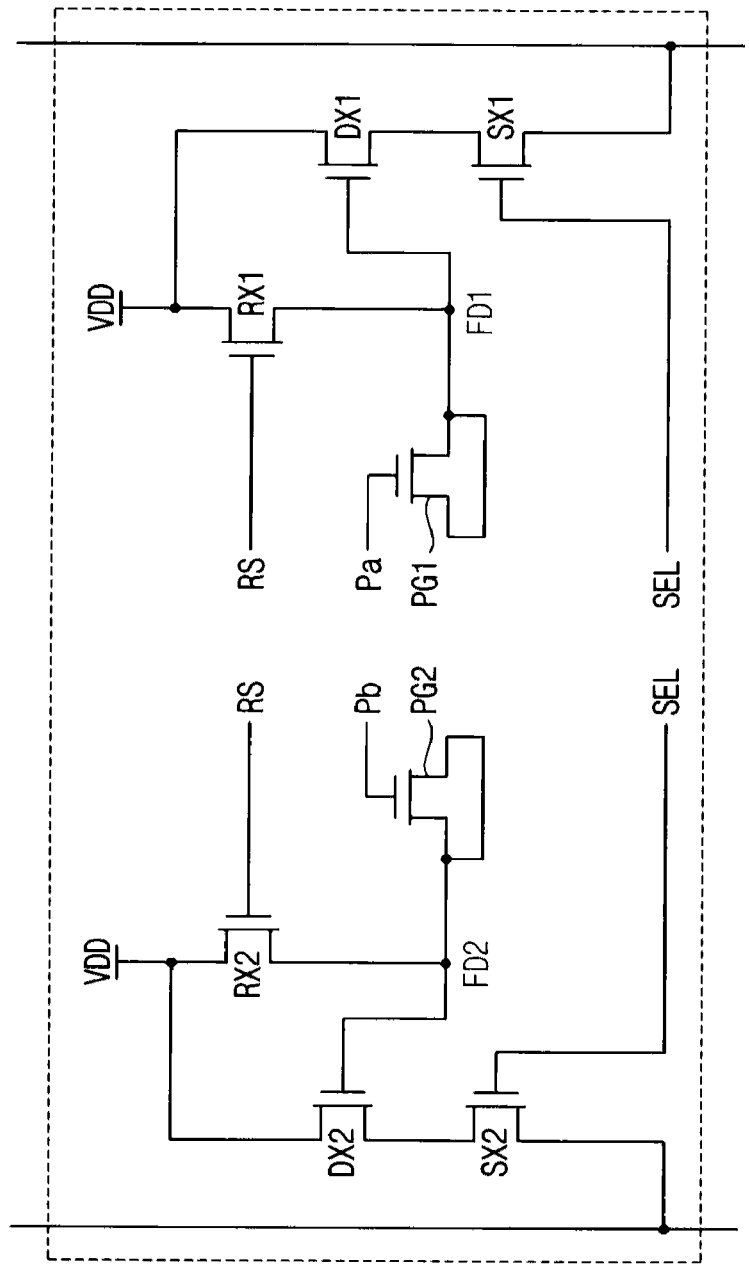
Figure 21:
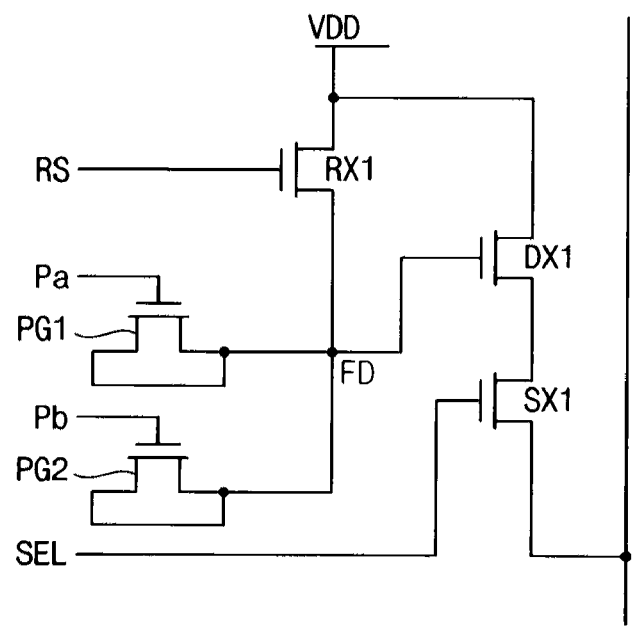

FIG. 20 illustrates an example similar to that of FIG. 18 but the transfer transistors TX1 and TX2 are omitted. FIG. 21 illustrates an example similar to that of FIG. 19 but the transfer transistors TX1 and TX2 are omitted.

Figure 22:
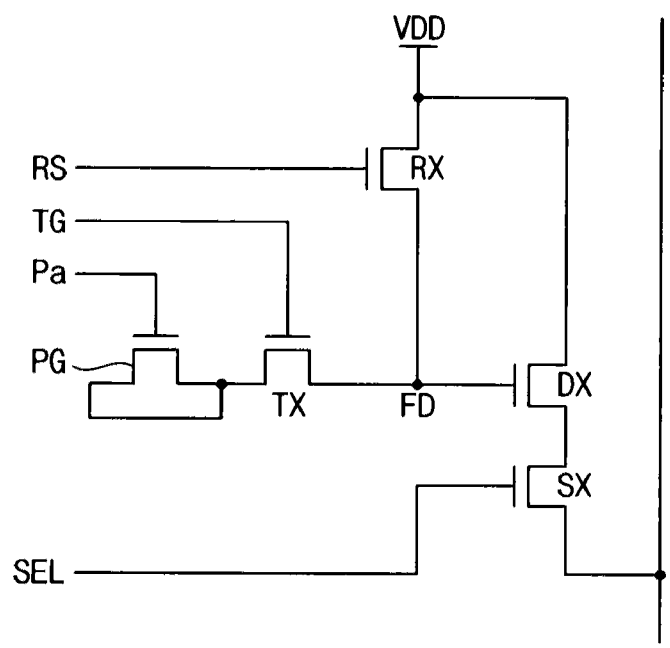
Figure 23:
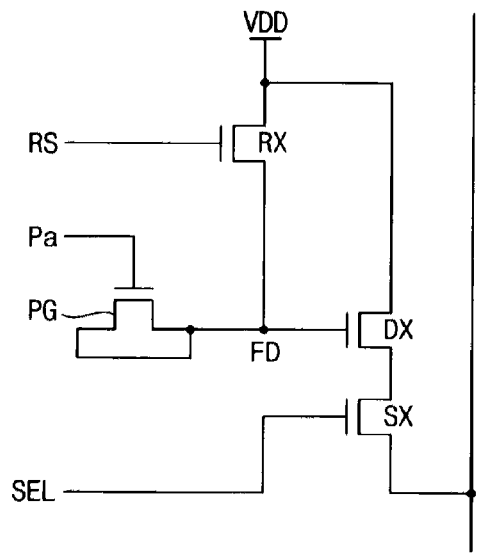

Referring to FIG. 22, the unit pixel may include a light-receiving region (not shown), a photo gate PG on the light-receiving region, a transfer transistor Tx, a sensing region FD, a reset transistor RX, a drive transistor Dx and a selection transistor SX. Even though one sensing region FD is illustrated in FIG. 22, the unit pixel may include another sensing region (not shown) for draining, which is disposed near the light-receiving region asymmetrically with the illustrated sensing region FD. FIG. 23 illustrates an example similar to that of FIG. 22 but the transfer transistor TX is omitted.

Figure 24:
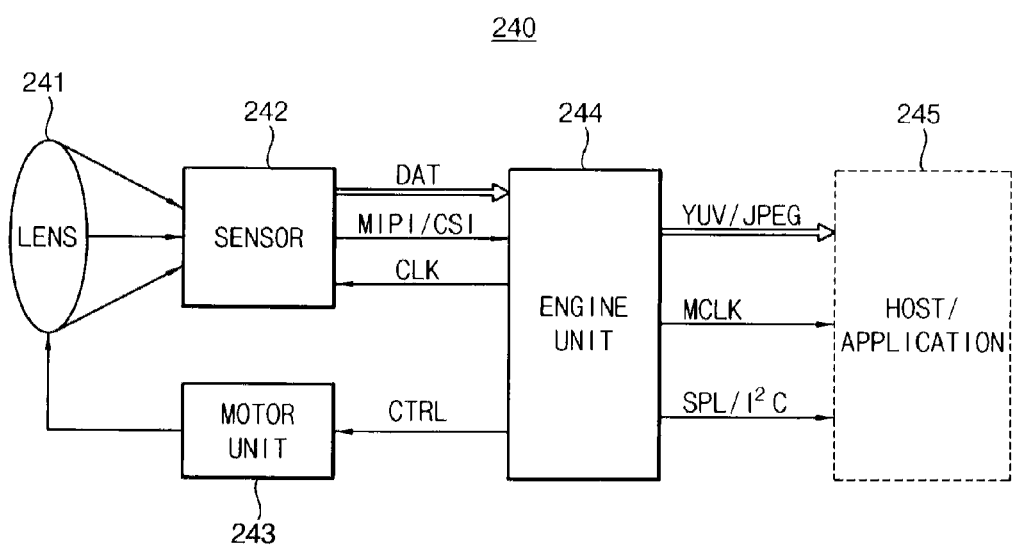
FIG. 24 is a block diagram illustrating a camera including a three-dimensional image sensor according to example embodiments.

FIG. 24 is a block diagram illustrating a camera including a three-dimensional image sensor according to example embodiments.

Referring to FIG. 24, a camera 240 includes a lens 241, a three-dimensional image sensor 242, a motor unit 243 and an engine unit 244. The three-dimensional image sensor 242 may include the image sensor and the depth sensor as illustrated in FIG. 15 or one integrated sensor chip as illustrated in FIG. 16. The three-dimensional image sensor 242 includes at least one unit pixel of asymmetric sensing regions as described with reference to FIGS. 1 through 13. A light source may be included in the three-dimensional image sensor 242.

The lens 241 may focus the incident light on the light-receiving region of the depth pixels and/or the color pixels of the three-dimensional image sensor 242. The three-dimensional image sensor 242 may generate data DAT including the distance information and/or the color image information based on the incident light passing through the lens 241. The three-dimensional image sensor 242 may provide the data DAT to the engine unit 244 in response to a clock signal CLK. In example embodiments, the three-dimensional sensor 242 may interface with the engine unit 244 using a mobile industry processor interface (MIPI) and/or a camera serial interface (CSI).

The motor unit 243 may control the focusing of the lens 241 or may perform shuttering in response to a control signal CTRL received from the engine unit 244. The engine unit 244 may control the three-dimensional image sensor 242 and the motor unit 243. The engine unit 244 may process the data DAT received from the three-dimensional image sensor 242. For example, the engine unit 244 may generate three-dimensional color data based on the received data DATA. In example embodiments, the engine unit 244 may generate YUV data including a luminance component, a difference between the luminance component and a blue component, and a difference between the luminance component and a red component based on the data DAT, or may generate compressed data, such as joint photography experts group (JPEG) data. The engine unit 244 may be coupled to a host/application 245, and may provide the data YUV/JPEG to the host/application 245 based on a master clock signal MCLK. In example embodiments, the engine unit 244 may interface with the host/application 245 using a serial peripheral interface (SPI) and/or an inter integrated circuit (I2C) interface.

Figure 25:
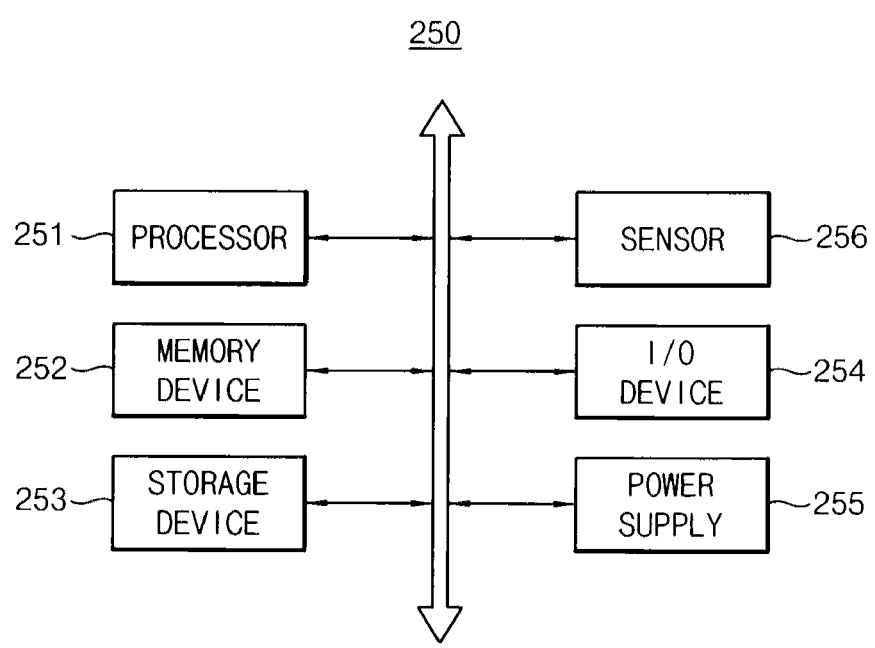
FIG. 25 is a block diagram illustrating a computing system including a three-dimensional image sensor according to example embodiments.

FIG. 25 is a block diagram illustrating a computing system including a three-dimensional image sensor according to example embodiments.

Referring to FIG. 25, a computing system 250 includes a processor 251, a memory device 252, a storage device 253, an input/output device 254, a power supply 255 and a sensor 256.

The sensor 256 may include the image sensor and the depth sensor as illustrated in FIG. 15 or one integrated sensor chip as illustrated in FIG. 16. The sensor 256 includes at least one unit pixel of asymmetric sensing regions as described with reference to FIGS. 1 through 13. A light source may be included in the sensor 256.

Although it is not illustrated in FIG. 25, the computing system 250 may further include a port for communicating with electronic devices, such as a video card, a sound card, a memory card, a USB device, etc.

The processor 251 may perform specific calculations and/or tasks. For example, the processor 251 may be a microprocessor, a central process unit (CPU), a digital signal processor, or the like. The processor 251 may communicate with the memory device 252, the storage device 253 and the input/output device 254 via an address bus, a control bus and/or a data bus.

The processor 251 may be coupled to an extension bus, such as a peripheral component interconnect (PCI) bus. The memory device 252 may store data for operating the computing system 250. For example, the memory device 252 may be implemented by a dynamic random access memory (DRAM), a mobile DRAM, a static random access memory (SRAM), a phase change random access memory (PRAM), a resistance random access memory (RRAM), a nano floating gate memory (NFGM), a polymer random access memory (PoRAM), a magnetic random access memory (MRAM), a ferroelectric random access memory (FRAM), or the like. The storage device 253 may include a solid state drive, a hard disk drive, a CD-ROM, or the like. The input/output device 254 may include an input device, such as a keyboard, a mouse, a keypad, etc., and an output device, such as a printer, a display device, or the like. The power supply 255 may supply power to the computing device 250.

The sensor 256 may be coupled to the processor 251 via the buses or other desired communication links. The sensor 256 and the processor 251 may be integrated in one chip, or may be implemented as separate chips. The computing system 250 may be any computing system including the sensor 256 according to example embodiments. For example, the computing system 250 may include a digital camera, a mobile phone, a smart phone, a personal digital assistant (PDA), a portable multimedia player (PMP), or the like.

FIG. 26 is a block diagram illustrating an example of an interface used in a computing system of FIG. 25.

Referring to FIG. 26, a computing system 260 may employ or support a MIPI interface, and may include an application processor 2600, a three-dimensional image sensor 2620 and a display device 2630. A camera serial interface (CSI) host 2602 of the application processor 2600 may perform a serial communication with a CSI device 2621 of the three-dimensional image sensor 2620 using a CSI. In example embodiments, the CSI host 2602 may include a deserializer DES, and the CSI device 2621 may include a serializer SER.

The three-dimensional image sensor 2620 may include the image sensor and the depth sensor as illustrated in FIG. 15 or one integrated sensor chip as illustrated in FIG. 16. The three-dimensional image sensor 2620 includes at least one unit pixel of asymmetric sensing regions as described with reference to FIGS. 1 through 13. A light source may be included in the three-dimensional image sensor 2620.

A display serial interface (DSI) host 2601 of the application processor 2600 may perform a serial communication with a DSI device 2631 of the display device 2630 using a DSI. In example embodiments, the DSI host 2601 may include a serializer SER, and the DSI device 2631 may include a deserializer DES.

The computing system 260 may further include a radio frequency (RF) chip 2640. A physical layer PHY 2603 of the application processor 2600 may perform data transfer with a physical layer PHY 2641 of the RF chip 2640 using a MIPI DigRF. The PHY 2603 of the application processor 2600 may interface (or, alternatively communicate) a DigRF MASTER 2604 for controlling the data transfer with the PHY 2641 of the RF chip 2640. The computing system 260 may further include a global positioning system (GPS) 2610, a storage device 2650, a microphone 2660, a DRAM 2670 and/or a speaker 2680. The computing system 260 may communicate with external devices using an ultra wideband (UWB) communication 2693, a wireless local area network (WLAN) communication 2692, a worldwide interoperability for microwave access (WIMAX) communication 2691, or the like. However, example embodiments are not limited to configurations or interfaces of the computing systems 250 and 260 illustrated in FIGS. 25 and 26.

Example embodiments may be used in any three-dimensional image sensor or any system including the three-dimensional image sensor, such as a computer, a digital camera, a three-dimensional camera, a mobile phone, a personal digital assistant (PDA), a scanner, a navigator, a video phone, a monitoring system, an auto focus system, a tracking system, a motion capture system, an image stabilizing system, or the like.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of inventive concepts. Accordingly, all such modifications are intended to be included within the scope of inventive concepts as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A unit pixel of a depth sensor, the unit pixel comprising:
a light-receiver configured to perform photoelectric conversion of an incident light to output an electrical signal; and
at least two sensors adjacent to the light-receiver to receive the electrical signal from the light-receiver such that a first imaginary line connecting the sensors forms an angle greater than zero degrees with respect to a second imaginary line, the second imaginary line passing through a center of the light-receiver in a horizontal direction.

2. The unit pixel of claim 1, wherein the light-receiver is between the sensors and the sensors are asymmetrical with respect to the second imaginary line and a third imaginary line, the third imaginary line passing through the center of the light-receiver in a vertical direction perpendicular to the horizontal direction.

3. The unit pixel of claim of claim 1, wherein the first imaginary line connecting the sensors forms an angle between zero degree and forty-five degrees with respect to the second imaginary line.

4. The unit pixel of claim 1, further comprising:
one or more photo gates on the light-receiver, the photo gates configured to control a transfer of the electrical signal to the sensors depending on voltages received by photo gates.

5. The unit pixel of claim 4, wherein the sensors correspond one-to-one with the photo gates.

6. The unit pixel of claim 1, wherein at least one of the sensors is configured to drain the electrical signal.

7. The unit pixel of claim 1, further comprising:
one or more transfer gates configured to control a transfer of the electrical signal to the sensors depending on voltages received by the transfer gates, each transfer gate on a region between each sensor and the light-receiver.

8. The unit pixel of claim 1, wherein the incident light includes an infrared light.

9. A depth sensor comprising:
a pixel array including a plurality of unit pixels; and
a circuit configured to calculate distance information based on signals from the pixel array,
wherein each unit pixel includes,
a light-receiver configured to perform photoelectric conversion of an incident light to output an electrical signal; and
at least two sensors adjacent to the light-receiver to receive the electrical signal from the light-receiver such that a first imaginary line connecting the sensors forms an angle greater than zero degrees with respect to a second imaginary line, the second imaginary line passing through a center of the light-receiver in a horizontal direction.

10. The depth sensor of claim 9, wherein the light-receiver is between the sensors and the sensors are asymmetrical with respect to the second imaginary line and a third imaginary line, the third imaginary line passing through the center of the light-receiver in a vertical direction perpendicular to the horizontal direction.

11. The depth sensor of claim 9, wherein the first imaginary line connecting the sensors forms an angle between zero degree and forty-five degrees with respect to the second imaginary line.

12. The depth sensor of claim 9, wherein each unit pixel further includes one or more photo gates on the light-receiver, the photo gates configured to control a transfer of the electrical signal to the sensors depending on voltages received by the photo gates.

13. The depth sensor of claim 12, further comprising:
a timing controller configured to control a timing of applying the voltages to the photo gates; and
a light source configured to output a light signal, the timing controller configured to control the light source.

14. The depth sensor of claim 13, wherein the light signal includes an infrared light and the light source includes a laser diode.

15. The depth sensor of claim 12, wherein the sensors correspond one-to-one with the photo gates.

16. An image sensor comprising:
at least one pixel including,
a receiver configured to receive light and convert the light into an electrical signal, the receiver having vertical and horizontal axes, and
at least first and second sensors adjacent to the receiver, the first and second sensors being asymmetrical with respect to the vertical and horizontal axes.

17. The image sensor of claim 16, wherein the first and second sensors are at a same angle with respect to the horizontal axis and a midpoint of the receiver.

18. The image sensor of claim 16, wherein the first sensor is configured to operate based on a first control signal and the second sensor is configured to operate based on a second control signal, the first and second control signals being complimentary.

19. The image sensor of claim 16, wherein the first sensor is configured to operate based on a first control signal and the second sensor is configured to receive a power supply voltage.

20. The image sensor of claim 16, wherein the receiver includes p-type impurities and the first and second sensors include n-type impurities.

* * * * *